United States Patent
Lai et al.

(10) Patent No.: US 7,803,702 B2
(45) Date of Patent: Sep. 28, 2010

(54) METHOD FOR FABRICATING MOS TRANSISTORS

(75) Inventors: Kuo-Chih Lai, Tai-Nan (TW); Yi-Wei Chen, Tai-Chung Hsien (TW); Nien-Ting Ho, Tainan (TW); Teng-Chun Tsai, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/189,203

(22) Filed: Aug. 11, 2008

(65) Prior Publication Data

US 2010/0035401 A1   Feb. 11, 2010

(51) Int. Cl.
*H01L 21/28* (2006.01)

(52) U.S. Cl. ............... 438/581; 438/630; 257/E21.634; 257/E21.636

(58) Field of Classification Search .......... 438/197, 438/199, 300–307, 581, 583, 630; 257/204, 257/E21.632, E21.634, E21.636
See application file for complete search history.

(56) References Cited

U.S. PATENT DOCUMENTS

| 6,077,750 | A | * | 6/2000 | Sohn et al. | 438/303 |
| 7,037,371 | B1 | * | 5/2006 | Hashimoto et al. | 117/108 |
| 7,247,535 | B2 | * | 7/2007 | Jain | 438/233 |
| 2007/0238321 | A1 | * | 10/2007 | Futase et al. | 438/905 |
| 2008/0296704 | A1 | * | 12/2008 | Wakabayashi | 257/410 |

* cited by examiner

*Primary Examiner*—Khiem D Nguyen
(74) *Attorney, Agent, or Firm*—Winston Hsu

(57) ABSTRACT

A method for fabricating metal-oxide transistors is disclosed. First, a semiconductor substrate having a gate structure is provided, in which the gate structure includes a gate dielectric layer and a gate. A source/drain region is formed in the semiconductor substrate, and a cleaning step is performed to fully remove native oxides from the surface of the semiconductor substrate. An oxidation process is conducted to form an oxide layer on the semiconductor substrate and the oxide layer is then treated with fluorine-containing plasma to form a fluorine-containing layer on the surface of the semiconductor substrate. A metal layer is deposited on the semiconductor substrate thereafter and a thermal treatment is performed to transform the metal layer into a silicide layer.

14 Claims, 4 Drawing Sheets

METHOD FOR FABRICATING MOS TRANSISTORS

BACKGROUND OF THE INVENTION

1. Field of the Invention

The invention relates to a method for fabricating MOS transistors, and more particularly, to a method for fabricating a fluorine-containing layer before performing a salicide process.

2. Description of the Prior Art

Field effect transistors are important electronic devices in the fabrication of integrated circuits, and as the size of the semiconductor device becomes smaller and smaller, the fabrication of the transistors also improves and is constantly enhanced for fabricating transistors with smaller sizes and higher quality.

In the conventional method of fabricating transistors, a gate structure is first formed on a substrate, and a lightly doped drain (LDD) is formed on the two corresponding sides of the gate structure. Next, a spacer is formed on the sidewall of the gate structure and an ion implantation process is performed to form a source/drain region within the substrate by utilizing the gate structure and spacer as a mask. In order to incorporate the gate, source, and drain into the circuit, contact plugs are often utilized for interconnection purposes, in which the contact plugs are composed of conducting metals such as tungsten and copper. Nevertheless, the interconnection between the contact plugs and the silicon material of the gate structure and the source/drain region is usually poor, hence a silicide material is often formed over the surface of the gate structure and the source/drain region to improve the ohmic contact between the contact plugs and the gate structure and the source/drain region. Today, the process known as self-aligned silicide (salicide) process has been widely utilized to fabricate silicide materials, in which a source/drain region is first formed, a metal layer comprised of cobalt, titanium, or nickel is disposed on the source/drain region and the gate structure, and a rapid thermal process (RTP) is performed to react the metal layer with the silicon contained within the gate structure and the source/drain region to form a metal silicide for reducing the sheet resistance of the source/drain region.

However, when the silicides are being formed, the atoms within the metal layer will diffuse into the substrate and deplete the silicon within the source/drain region, thereby damaging the original lattice structure of the source/drain region and causing the PN junction between the source/drain region and the silicon substrate to react with the silicon contained within the source/drain region as a result of an overly short distance between the PN junction and the silicide layer. Ultimately, the problems become much worse in the design of ultra shallow junctions (USJ) as the silicides often come in contact directly with the substrate and result in failure of the device.

Referring to FIGS. 1-2, FIGS. 1-2 are illustrate a method for fabricating a MOS transistor according to the prior art. As shown in FIG. 1, a gate structure 66 having a gate dielectric layer 62 and a gate conductive layer 64 is first formed on a substrate 60. A cap layer (not shown) is also deposited on top of the gate 66, in which the cap layer is composed of dielectric material such as silicon nitride. Next, an ion implantation process is performed to form a lightly doped drain 70 in the substrate 60. Next, a liner 67 and a spacer 68 are formed on the sidewall of the gate structure 66 and another ion implantation is performed to form a source/drain region 72 in the substrate 60. Next, a wet cleaning process is performed to remove native oxides and other impurities from the surface of the gate structure 66 and the source/drain region 72, and a degas process is performed to remove the remaining water vapor from the wet cleaning process. Next, a sputtering process is performed to form a metal layer 74 over the surface of the gate conductive layer 64, the spacer 68, and the substrate 60. Subsequently, as shown in FIG. 2, a rapid thermal annealing (RTA) process is performed to react the contact area between the metal layer 74 and the gate conductive layer 64 and the source/drain region 72 into a silicide layer 76. Next, a selective wet etching process is performed to remove the unreacted metal layer 74 by utilizing mixtures containing ammonia/hydrogen peroxide/water or sulfuric acid/hydrogen peroxide.

In order to prevent the short channel effect of the transistors and improve the interconnect resistance of the integrated circuit, the junction depth of the source and drain needs to be effectively reduced for fabricating transistors containing silicides. However, if the thickness of the silicides on the source and drain is decreased while reducing the junction depth of the source and drain, the interconnect resistance and contact resistance may increase simultaneously. On the other hand, if the depth of the silicides is kept constant, the distance between the PN junction of the source/drain region 72 and the silicon substrate and the silicide layer 76 may become overly short and result in junction leakage. Additionally, the mixture utilized during the wet cleaning process will corrode the liner disposed between the gate electrode and the spacer and cause the silicide to approach the channel area during silicide formation and result in a nickel silicide piping phenomenon.

Moreover, due to high temperature of the PVD chamber or the degas process, the as-deposition formed before the rapid thermal annealing process will result in silicides with polycrystalline structure and degrade the overall thermal stability. In other words, when the treatment temperature is too high or process time of the treatment is too long, the silicides will become pieces of unconnected mass and result in an agglomeration phenomenon and increase the sheet resistance. Additionally, a high temperature will induce a conversion and consume silicon excessively, and cause a spiking phenomenon in the ultra shallow junction or forming a high resistivity structure, such as converting the low resistivity state nickel silicide (NiSi) having less than 20 μΩ-cm to a high resistivity state nickel disilicide (NiSi$_2$) having approximately 50 μΩ-cm.

SUMMARY OF THE INVENTION

It is an objective of the present invention to provide a method of fabricating MOS transistors for resolving issues such as silicide piping or agglomeration of silicide metal caused by conventional technique.

According to a preferred embodiment of the present invention, a method for fabricating metal-oxide transistors is disclosed. First, a semiconductor substrate having a gate structure is provided, in which the gate structure includes a gate dielectric layer and a gate conductive layer. A source/drain region is formed in the semiconductor substrate, and a cleaning step is performed to remove native oxides from the surface of the semiconductor substrate. An oxidation process is conducted to form an oxide layer on the semiconductor substrate and the oxide layer is then treated with fluorine-containing plasma to form a fluorine-containing layer on the surface of the semiconductor substrate. A metal layer is deposited on the semiconductor substrate thereafter and a thermal treatment is performed to transform the metal layer into a silicide layer.

The present invention specifically conducts a cleaning process to fully remove native oxides from the surface of the semiconductor substrate before the salicide process is performed, and conducts an oxidation process thereafter to form an oxide layer over the surface of the semiconductor substrate. This oxide layer is later treated with fluorine-containing plasma to transform into a fluorine-containing layer, and a salicide process is conducted thereafter. As the fluorine atom embedded within the fluorine-containing layer could be used to prevent silicide metal formed thereafter from being too close to the channel region and also protect silicide from high temperature of degassing process, problems such as salicide piping and agglomeration can be improved significantly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
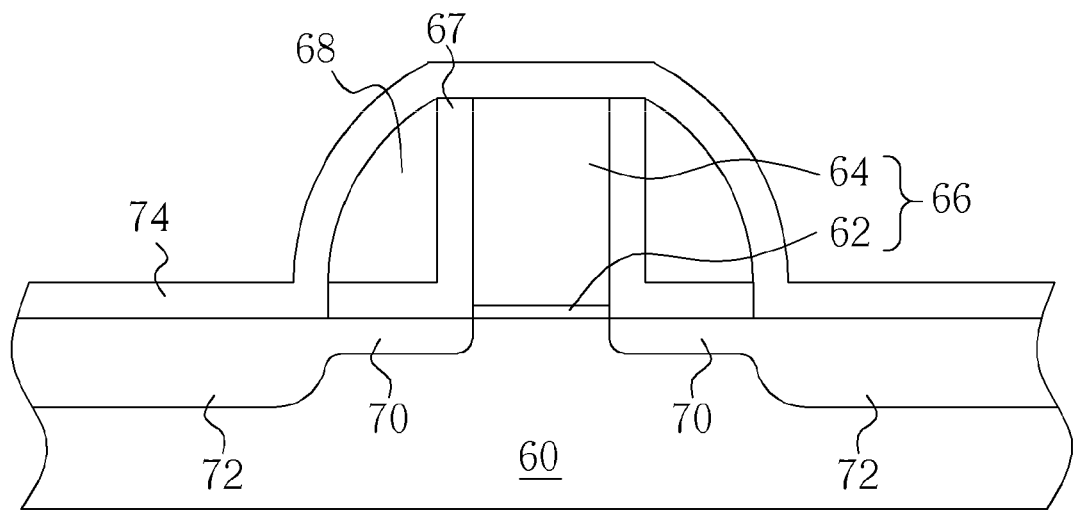
FIGS. 1-2 are illustrate a method for fabricating a MOS transistor according to the prior art.
Figure 2:
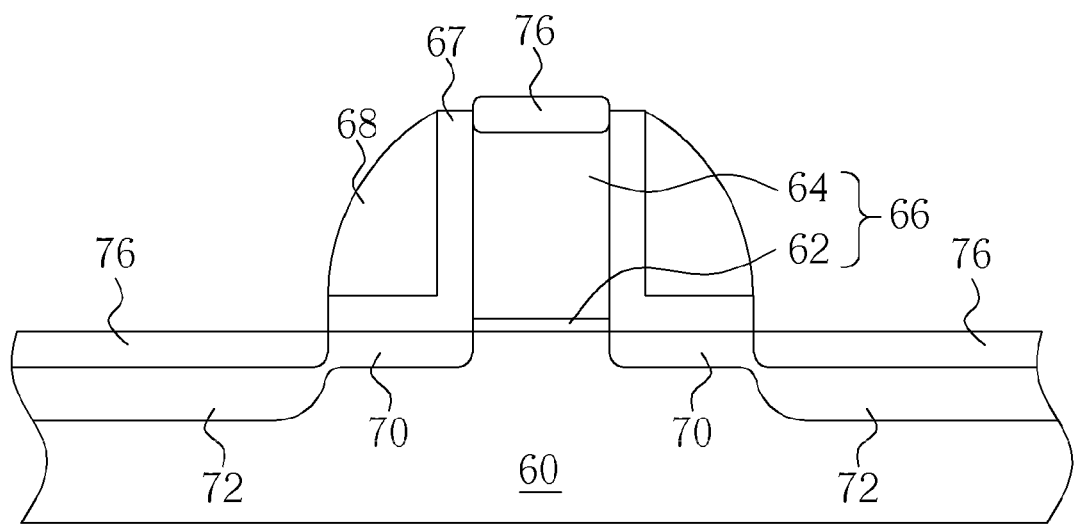
Figure 3:
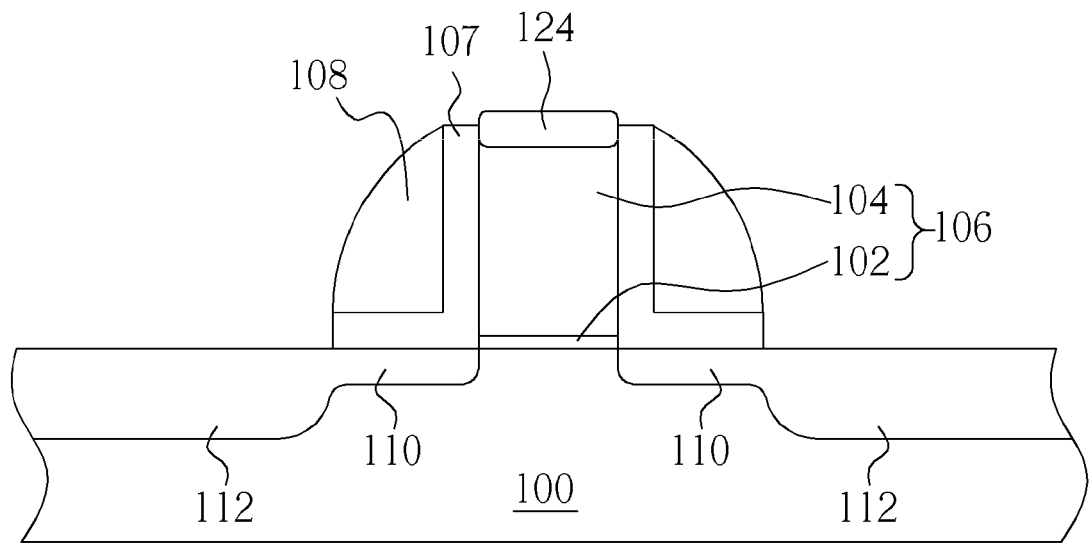
FIGS. 3-7 illustrate a method for fabricating a MOS transistor according to a preferred embodiment of the present invention.

Referring to FIGS. 3-7, FIGS. 3-7 illustrate a method for fabricating a MOS transistor according to a preferred embodiment of the present invention. As shown in FIG. 3, a substrate 100, such as a wafer or a silicon-on-insulator (SOI) substrate is provided. Preferably, the semiconductor substrate 100 may include structures such as gates, source/drain regions, isolation regions, word lines, or resistors depending on different product demands and fabrication processes. According to the preferred embodiment of the present invention, a gate structure and source/drain region of a MOS transistor are utilized as an example, as shown in FIGS. 3-7. As shown in FIG. 3, the gate structure 106 includes a gate dielectric layer 102 and gate conductive layer 104. The gate dielectric layer 102 is preferably composed of insulating material such as silicon nitrides, oxides, oxynitrides, or metal oxides, and the gate conductive layer 104 is composed of conductive material such as doped polysilicon, silicides, or metal. A cap layer 124 is also formed on top of the gate conductive layer 104, in which the cap layer 124 is composed of dielectric material such as silicon nitride or silicon oxide.

Next, a lightly doped ion implantation process is performed by using the gate conductive layer 104 as mask to implant dopants into the semiconductor substrate 100 with respect to two sides of the gate conductive layer 104 for forming a source/drain extension or a lightly doped source/drain 110. The implanted dopants are preferably selected according to the type of MOS transistor being fabricated. For instance, n-type dopants including phosphorus or arsenic would be implanted for fabricating a NMOS transistor, whereas p-type dopants including boron would be used for a PMOS transistor. Additionally, a spacer (not shown) could be selectively formed prior to the formation of the source/drain extension or the lightly doped source/drain 110. By doing so, this selectively formed spacer and the gate 104 could be using as a mask during the lightly doped ion implantation process.

A liner 107 composed of silicon oxide and one or more spacer 108 composed of silicon nitride compound are selectively formed on the sidewall of the gate structure 106, in which the liner 107 and the spacer 108 could be composed of any dielectric material. Next, a heavily doped ion implantation is performed by using the gate conductive layer 104 and the spacer 108 as mask to implant heavy dopants into the semiconductor substrate 100 for forming a source/drain region 112. Similar to the ion implantation conducted for the aforementioned lightly doped source/drain 110, dopants implanted for a NMOS transistor would include phosphorus or arsenic, whereas dopants implanted for a PMOS transistor would include boron. Next, a thermal annealing process is performed by using a temperature between 1000° C. to 1020° C. to activate the dopants within the semiconductor substrate 100 and repair the damage of the crystal lattice structure of the semiconductor substrate 100 caused during the ion implantation process.

In addition to the aforementioned process, the order for fabricating the spacer, the lightly doped source/drain and the source/drain region could be adjusted according to the demand of the product, which are all within the scope of the present invention. For instance, in one embodiment, one or more spacer could be formed, the lightly doped source/drain is formed thereafter, and after removing the spacer or the outer most layer of the spacer, ion implantation is conducted to form the source/drain region. In another embodiment, two recesses could be formed in the substrate with respect to two sides of the gate structure prior to the formation of the source drain region, and an epitaxial layer could be grown through selective epitaxial growth process in the two recesses thereafter. The epitaxial layer is preferably composed of material suitable for NMOS transistor, such as SiC, or material suitable for PMOS transistor, such as SiGe.

Figure 4:
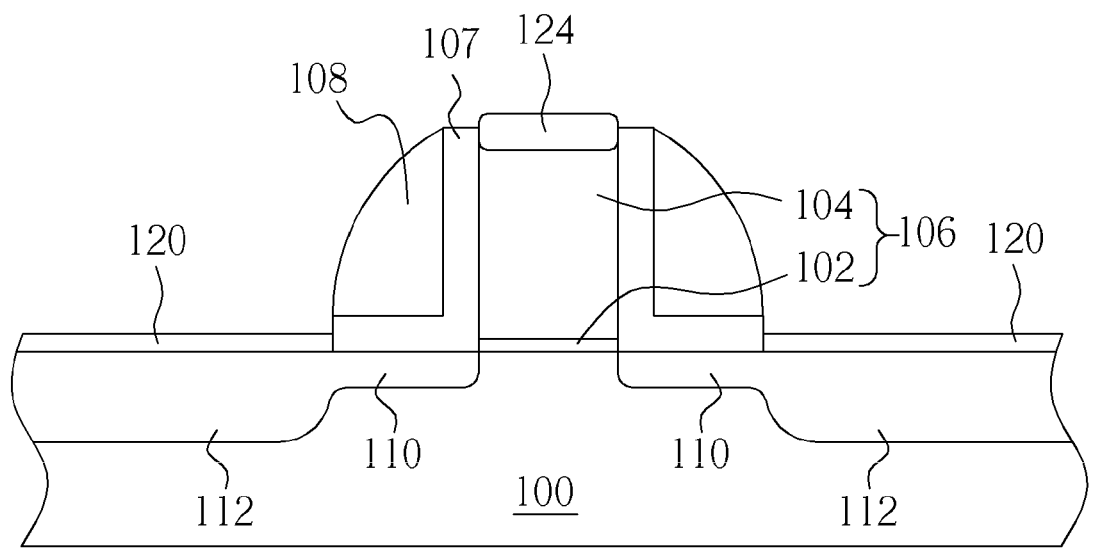

Next, a cleaning process is conducted by using a cleaning solution such as hydrogen fluoride (HF) to fully remove native oxides and other impurities from the surface of the source/drain region 112, and a degassing step could be conducted thereafter to remove excess water vapor produced by the cleaning process. As shown in FIG. 4, an oxidation step is conducted by using an oxidant to oxidize the surface of the semiconductor substrate 100. According to a preferred embodiment of the present invention, the oxidant used for conducting the oxidation process may include ammonium peroxide mixture (APM) or hydrogen peroxide ($H_2O_2$). The oxidation preferably forms an oxide layer 120 having a depth of approximately 5 angstroms to 20 angstroms on the surface of the semiconductor substrate 100, in which the oxide layer 120 is primarily composed of silicon dioxide. It should be further noted that fabrication parameters such as temperature, oxidant concentration, and oxidizing time could all be controlled to form an oxide layer 120 having a predetermined depth.

Figure 5:
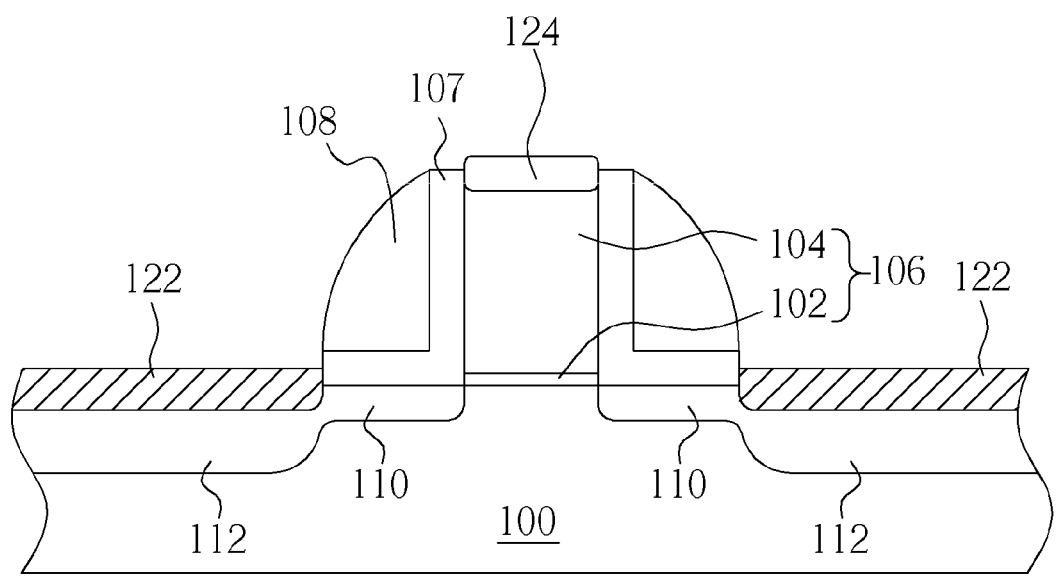

As shown in FIG. 5, a fluorine-containing plasma is utilized to react with the oxide layer 120 for forming a fluorine-containing layer 122. In this embodiment, reacting gases such as nitrogen trifluoride ($NF_3$) and ammonia ($NH_3$) are first mixed to form a gaseous mixture of ammonium fluoride ($NH_4F$) and ammonium fluoride-hydrogen fluoride ($NH_4F.HF$). This gaseous mixture is then used to react with the oxide layer 120 for forming a fluorine-containing layer 122 composed of ammonium fluorosilicate (($NH_4)_2SiF_6$). It should be noted that the plasma could be an in-situ plasma formed in the reaction chamber and react directly with the semiconductor substrate 100, or a remote plasma which can be transported to the reaction chamber to react with the semiconductor substrate 100. The reaction is preferably carried out in a low temperature environment, such as room temperature. Preferably, the fluorine atom contained within the layer 122 can be used to prevent problem such as piping or agglomeration caused during the salicide process.

Figure 6:
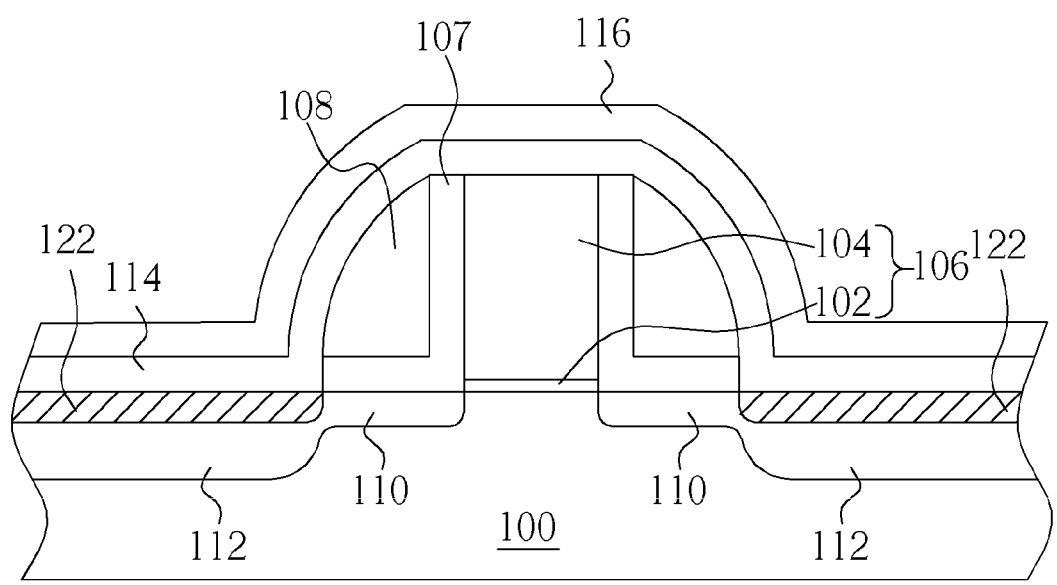

Next, as shown in FIG. 6, an in-situ deposition can be performed by sputtering a metal layer 114 on the substrate 100 to cover the surface of the gate structure 106, the spacer 108, and the source/drain region 112 while controlling the temperature of the PVD chamber under 150° C. Preferably, the metal layer 114 is selected from a group consisting of tungsten, cobalt, titanium, nickel, platinum, palladium, and molybdenum. Moreover, the cleaning process used to remove the oxide layer 120 or an extra etching process could be conducted before the formation of the metal layer 114 to remove the cap layer 124, which is also within the scope of the present invention.

Next, a cap layer 116 composed of titanium or titanium nitride is selectively formed over the surface of the metal layer 114 while maintaining the temperature of the PVD chamber under 150° C. As NiSi produced after the salicide process often causes serious junction leakage, the formation of the cap layer 116 preferably prevents oxygen atoms from entering the metal layer 114 during the rapid thermal annealing process while improving the strain of the material on the edge of the device.

Figure 7:
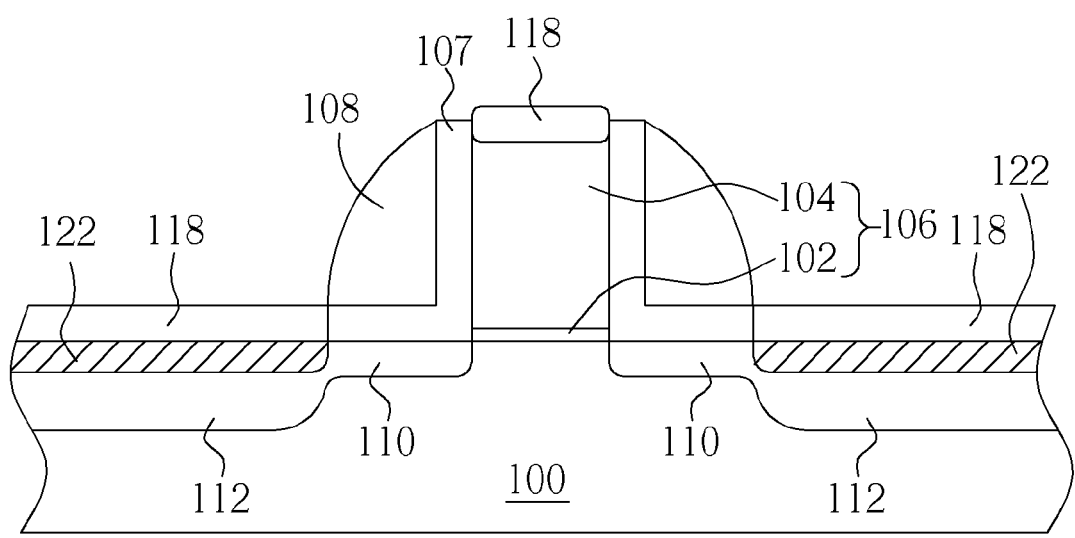

As shown in FIG. 7, a rapid thermal annealing process is performed to heat the semiconductor substrate 100 to 200-400° C. The thermal anneal preferably transforms the metal layer 114 contacting the gate conductive layer 104 and the source/drain region 112 to a silicide layer 118. After the rapid thermal annealing process, an etching process is performed by utilizing a conventional wet etching mixture including ammonia, hydrogen peroxide, hydrochloric acid, sulfuric acid, nitric acid, and acetic acid to remove un-reacted metal layer 114 and cap layer 116. This completes the fabrication of a MOS transistor.

Preferably, the aforementioned plasma treatment process, the sputtering of the metal layer 114 and the cap layer 116, and the rapid thermal annealing process could be conducted in different reaction chamber of the same cluster. In other words, the aforementioned processes could be performed without breaking the vacuum, thereby eliminating the chance of contaminating the substrate by outside dirt or water vapor.

It should be noted that the aforementioned embodiment forms the suicide layer directly on the fluorine-containing layer 122 as soon as the fluorine-containing layer 122 is fabricated. In other words, no extra process is conducted between the formation of the fluorine-containing layer 122 and the metal deposition thereafter. Alternatively, the depth of the fluorine-containing layer 122 could also be adjusted by conducting a heating process as soon as the fluorine-containing layer 122 is formed. For instance, the heating process could be conducted by using a heating plate, a heating lamp, or other heating devices. Preferably, this heating process would drive fluorine atoms of the fluorine-containing layer 122 into the semiconductor substrate 100 for adjusting the depth of the fluorine-containing layer 122, which is all within the scope of the present invention. After the drive-in is accomplished, the deposition of metal for the salicide process could follow up and another rapid thermal anneal could be applied thereafter. It should also be noted that the aforementioned plasma treatment process for forming the fluorine-containing layer, the heating process conducted after the formation of the fluorine-containing layer, the sputtering of the metal layer 114, the sputtering of the cap layer 116, and the rapid thermal annealing process could be conducted in different reaction chamber of the same cluster. Hence, the aforementioned processes could be performed without breaking the vacuum, thereby eliminating the chance of contaminating the substrate by outside dirt or water vapor. Moreover, the depth of the fluorine-containing layer 122 and the amount of fluorine atom being driven into the semiconductor substrate 100 could also be adjusted according to the depth of the oxide layer 120. For instance, as the depth of the oxide layer 120 increases, the depth of the fluorine-containing layer 122 also increases accordingly, and as the depth of the fluorine-containing layer 122 increases, the amount of fluorine atom capable of being driven into the semiconductor substrate 100 also increases accordingly.

Overall, the present invention specifically conducts a cleaning process to fully remove native oxides from the surface of the semiconductor substrate before the salicide process is performed, and conducts an oxidation process thereafter to form an oxide layer over the surface of the semiconductor substrate. This oxide layer is later treated with fluorine-containing plasma to transform into a fluorine-containing layer, and a salicide process is conducted thereafter. As the fluorine atom embedded within the fluorine-containing layer could be used to prevent silicide metal from being too close to the channel region and protect silicide from high temperature of degassing process, aforementioned problems such as salicide piping and agglomeration can be improved significantly.

Those skilled in the art will readily observe that numerous modifications and alterations of the device and method may be made while retaining the teachings of the invention.

What is claimed is:

1. A method for fabricating a MOS transistor, comprising:
providing a semiconductor substrate;
forming a gate structure on the semiconductor substrate, wherein the gate structure comprises a gate dielectric layer and a gate conductive layer;
forming a source/drain region in the semiconductor substrate;
performing a cleaning process to remove oxides from the surface of the semiconductor substrate;
utilizing an oxidant comprising ammonium peroxide mixture (APM) or hydrogen peroxide ($H_2O_2$) to oxidize the surface of the semiconductor substrate for forming an oxide layer comprising silicon dioxide directly on the source/drain region;
after forming the oxide layer, reacting the oxide layer with a fluorine-containing plasma for forming a fluorine-containing layer;
depositing a metal layer on the semiconductor substrate; and
performing a thermal treatment for forming a silicide layer.

2. The method of claim 1, wherein the gate structure further comprises a spacer surrounding the gate conductive layer.

3. The method of claim 1, further comprising utilizing hydrogen fluoride for conducting the cleaning process.

4. The method of claim 1, wherein the oxide layer comprises a depth between 5 angstroms to 20 angstroms.

5. The method of claim 1, wherein the fluorine-containing plasma comprises nitrogen trifluoride ($NF_3$) and ammonia ($NH_3$).

6. The method of claim 1, wherein the metal layer comprises tungsten, cobalt, titanium, nickel, platinum, palladium, molybdenum, or alloy thereof.

7. The method of claim 1, further comprising performing a heating process after forming the fluorine-containing layer and before depositing the metal layer.

8. The method of claim 1, wherein the thermal treatment is a rapid thermal annealing process.

9. The method of claim 1, further comprising performing an implantation process for forming the source/drain region.

10. The method of claim 1, wherein the step of forming the source/drain region further comprises:
 forming two recesses at two sides of the gate structure; and
 depositing a material into the two recesses.

11. The method of claim 10, further comprising in-situ doping an epitaxial material into the two recesses.

12. The method of claim 10, wherein the step of depositing a material into the two recesses further comprises:
 depositing an epitaxial material; and
 implanting dopants.

13. The method of claim 10, wherein the cleaning process further comprises fully removing or partially removing oxides from the surface of the semiconductor substrate.

14. A method for fabricating a MOS transistor, comprising:
 providing a semiconductor substrate;
 forming a gate structure on the semiconductor substrate, wherein the gate structure comprises a gate dielectric layer and a gate conductive layer;
 forming a source/drain region in the semiconductor substrate;
 performing a cleaning process to remove oxides from the surface of the semiconductor substrate;
 utilizing an oxidant comprising ammonium peroxide mixture (APM) or hydrogen peroxide ($H_2O_2$) to oxidize the surface of the semiconductor substrate for forming an oxide layer comprising silicon dioxide directly on the source/drain region;
 reacting the oxide layer with a fluorine-containing plasma for forming a fluorine-containing layer;
 performing a heating process to drive-in fluorine ions of the fluorine-containing layer into the semiconductor substrate;
 depositing a metal layer on the semiconductor substrate; and
 performing a thermal treatment for forming a silicide layer.

* * * * *